US012562714B2

(12) United States Patent
Barsukou et al.

(10) Patent No.: US 12,562,714 B2
(45) Date of Patent: Feb. 24, 2026

(54) TRANSVERSAL LAMB WAVE FILTER WITH IMPROVED OUT OF BAND REJECTION

(71) Applicant: SKYWORKS SOLUTIONS, INC., Irvine, CA (US)

(72) Inventors: Siarhei Dmitrievich Barsukou, Takarazuka (JP); Hiroyuki Nakamura, Osaka-Fu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 474 days.

(21) Appl. No.: 17/937,836

(22) Filed: Oct. 4, 2022

(65) Prior Publication Data

US 2023/0105794 A1 Apr. 6, 2023

Related U.S. Application Data

(60) Provisional application No. 63/252,255, filed on Oct. 5, 2021.

(51) Int. Cl.
| | |
|---|---|
| *H03H 9/64* | (2006.01) |
| *H03H 9/145* | (2006.01) |
| *H03H 9/25* | (2006.01) |

(52) U.S. Cl.
CPC .......... *H03H 9/6483* (2013.01); *H03H 9/145* (2013.01); *H03H 9/25* (2013.01)

(58) Field of Classification Search
CPC ......... H03H 9/6483; H03H 9/145; H03H 9/25
See application file for complete search history.

(56) References Cited

U.S. PATENT DOCUMENTS

| | | | | |
|---|---|---|---|---|
| 6,229,409 | B1 * | 5/2001 | Tsubouchi | ........... H03H 9/6406 |
| | | | | 333/155 |
| 2021/0119606 | A1 * | 4/2021 | Lu | ....................... H03H 9/02559 |
| 2021/0265980 | A1 * | 8/2021 | Ballandras | ......... H03H 9/02771 |

OTHER PUBLICATIONS

Hung et al., "Design and fabrication of an AT-cut quartz phononic Lamb wave resonator", Journal of Micromechanics and Microengineering, 23 (2013), 065025, 6 pages.
Kherraz et al., "Tunable phononic structures using Lamb waves in a piezoceramic plate", Physical Review B 99, 094302 (2019), 12 pages.
Kokkonen et al., "Scattering of surface acoustic waves by a phononic crystal revealed by heterodyne interferometry", Applied Physics Letters, 91(8), 1-3 [083517] (2007).
Wang et al., "Guiding and splitting Lamb waves in coupled-resonator elastic waveguides", Composite Structures, Elsevier, 2018, 206, pp. 588-593.

* cited by examiner

*Primary Examiner* — Samuel S Outten
(74) *Attorney, Agent, or Firm* — Lando & Anastasi, LLP

(57) ABSTRACT

A Lamb wave filter is provided which has improved out of band rejection, the filter including a substrate having a center region and two edge regions, a first set of electrodes arranged as a first interdigital transducer displaced on one of the two edge regions and configured to receive an input signal, a second set of electrodes arranged as a second interdigital transducer displaced on the other of the two edge regions and configured to provide a filtered output signal, and a third set of electrodes disposed parallel to the first and second sets of electrodes on the center region of the substrate.

21 Claims, 15 Drawing Sheets

FREQ GHz dB

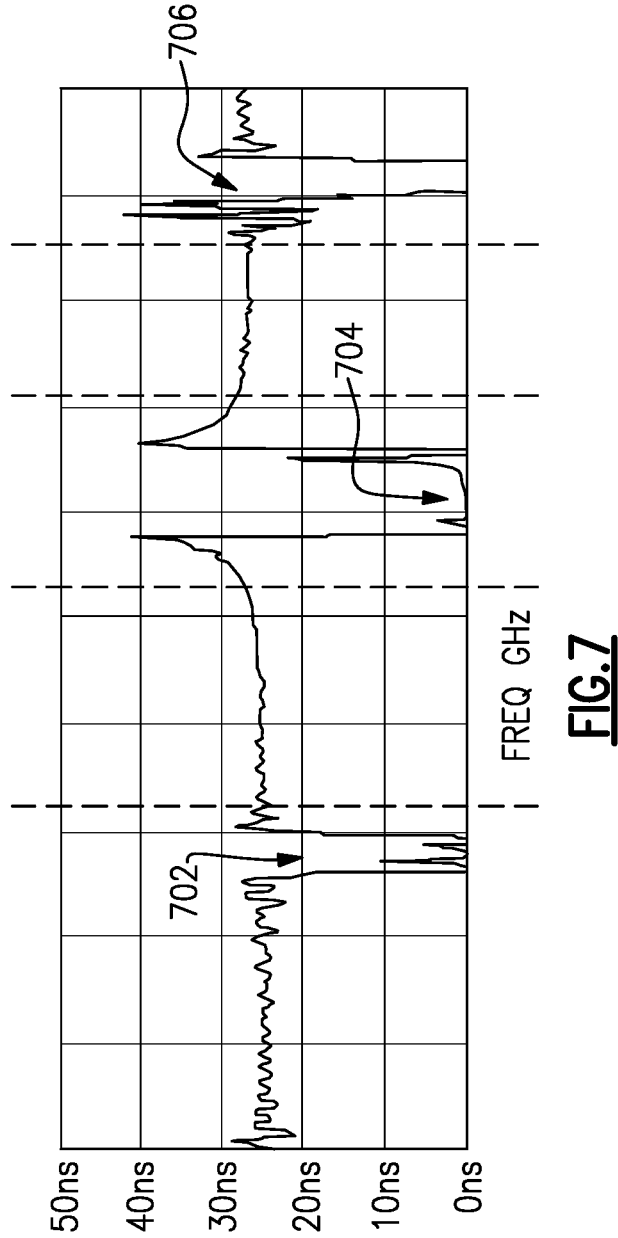
FREQ GHz
FIG.7

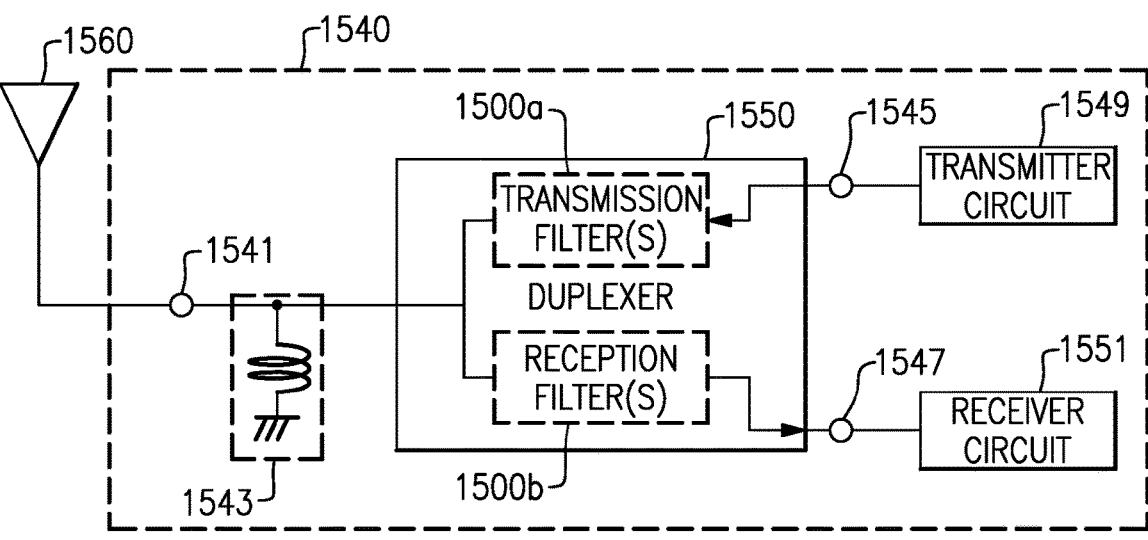
_FIG.15_
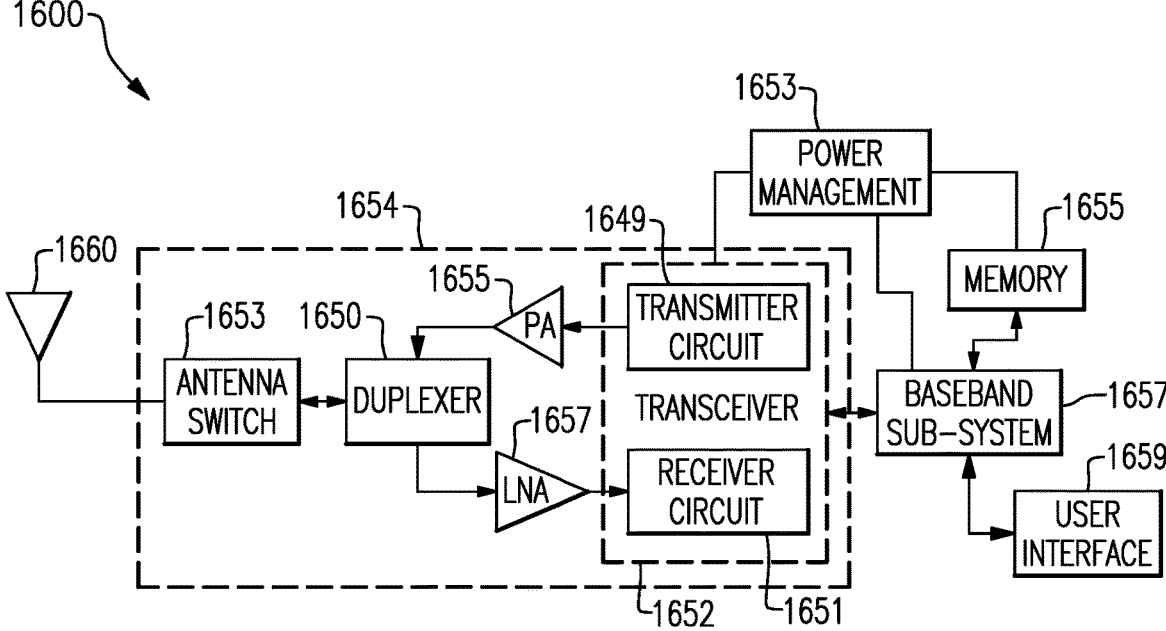
_FIG.16_

TRANSVERSAL LAMB WAVE FILTER WITH IMPROVED OUT OF BAND REJECTION

CROSS-REFERENCE TO RELATED APPLICATIONS

This application claims priority under 35 U.S.C. § 119(e) to U.S. Provisional Patent Application Ser. No. 63/252,255, titled "TRANSVERSAL LAMB WAVE FILTER WITH IMPROVED OUT OF BAND REJECTION," filed Oct. 5, 2021, the entire contents of which is incorporated herein in its entirety for all purposes.

BACKGROUND

Field

Aspects and embodiments disclosed herein relate to transversal Lamb wave filters, and in particular, to transversal Lamb wave filters with improved out of band rejection compared to known Lamb wave filters.

Description of the Related Technology

Modern radio transmission often uses multiple signals at narrowly specified frequencies, so as to fit a greater number of discreet signals within a particular large range of frequencies. Known Lamb wave filters often have poor out of band rejection at the edges of their passband, with very slim band gaps. This means that rejection of out of band signals is not always provided at an acceptable level for a particular operation, and as such there is a limit on the number of signals which can be transmitted within a frequency range. Furthermore, known Lamb wave filters have a single passband, which means that multiple filters must be used to filter multiple channels in the frequency range.

SUMMARY

According to one embodiment there is provided a Lamb wave filter with improved out of band rejection. The filter comprises a substrate having a center region and two edge regions and configured to propagate a Lamb wave within, a first set of electrodes arranged as a first interdigital transducer displaced on one of the two edge regions and configured to receive an input signal, a second set of electrodes arranged as a second interdigital transducer displaced on the other of the two edge regions and configured to provide a filtered output signal, and a third set of electrodes disposed on the center region of the substrate.

In one example the first and second sets of electrodes contain the same number of electrodes.

In one example the first and second sets of electrodes contain 20 or fewer electrodes.

In one example the first and second sets of electrodes contain 16 or fewer electrodes.

In one example the third set of electrodes contains a greater number of electrodes than either of the first or second sets of electrodes.

In one example the third set of electrodes contains a smaller number of electrodes than either of the first or second sets of electrodes.

In one example the third set of electrodes contains the same number of electrodes as one of the first or second sets of electrodes.

In one example the pitch of the third set of electrodes is greater than the pitch of either of the first or second sets of electrodes.

In one example the pitch of the third set of electrodes is 1.37 μm and the pitch of the first and second sets of electrodes is 1.20 μm.

In one example the pitch of the third set of electrodes is less than the pitch of either of the first or second sets of electrodes.

In one example the pitch of the third set of electrodes is 1.07 μm and the pitch of the first and second sets of electrodes is 1.20 μm.

In one example the pitch of the third set of electrodes is equal to the pitch of one of the first or second sets of electrodes.

In one example the pitch of all sets of electrodes is 1.20 μm.

In one example the pitch of the first and second sets of electrodes is the same.

In one example the pitch of the first and second sets of electrodes is 1.20 μm.

In one example the substrate is made of any one of aluminum nitride, doped aluminum nitride, in particular scandium doped aluminum nitride, zinc oxide, lithium niobite, or any suitable piezoelectric material.

In one example the first and second sets of electrodes are made of any one of aluminum, tungsten, copper, gold, silver, platinum, ruthenium, molybdenum, or other metals.

In one example the third set of electrodes is made of any one of aluminum, tungsten, copper, gold, silver, platinum, ruthenium, molybdenum, or other metals.

In one example the thickness of the substrate is equal to 0.1 to 1 times the wavelength of the Lamb wave.

In one example the thickness of the substrate is equal to 0.3 times the wavelength of the Lamb wave.

In one example the thickness of each electrode is equal to 0.01 to 0.5 times the wavelength of the Lamb wave.

In one example the thickness of the electrodes of the first and second sets of electrodes is equal to 0.03 times the wavelength of the Lamb wave.

According to another embodiment there is provided a method of providing a band gap within the passband of a Lamb wave filter comprising disposing a set of electrodes on a center region of the Lamb wave filter between an input set of electrodes and an output set of electrodes.

According to another embodiment there is provided a method of providing an improved band gap within the passband of a filtered signal. The method comprises providing a substrate, disposing a first interdigital transducer at a first end of the substrate, disposing a second interdigital transducer at a second end of the substrate, disposing a set of electrodes between the first and second interdigital transducers, providing an input signal to the first interdigital transducer such that the first interdigital transducer propagates a Lamb wave within the substrate which is received by the second interdigital transducer and provided as an output, and such that the set of electrodes substantially interferes with the propagation to block a desired frequency of the input signal.

In one example disposing the first interdigital transducer and disposing the second interdigital transducer are carried out as part of the same process step.

According to another embodiment there is provided a circuit comprising a first filter as described above and a second filter as described above connected in parallel such that the first interdigital transducer of the first filter is connected to the first interdigital transducer of the second filter, and the second interdigital transducer of the first filter is connected to the second interdigital transducer of the second filter, the first interdigital transducers of both filters being configured to receive the same input signal and the second interdigital transducers of both filters being configured to jointly output a filtered signal.

According to another embodiment there is provided a circuit comprising a first filter as described above and a second filter as described above connected in series such that the second interdigital transducer of the first filter is connected to the first interdigital transducer of the second filter, the first interdigital transducer of the first filter being configured to receive an input signal and the second interdigital transducer of the second filter being configured to output a filtered signal.

According to another embodiment there is provided a circuit comprising a first filter as described above and a second filter as described above connected in a series parallel configuration such that the second interdigital transducer of the first filter is connected to the first interdigital transducer of the second filter, the second interdigital transducer of the second filter being connected to ground, the first interdigital transducer of the first filter being configured to receive an input signal and the second interdigital transducer of the first filter and the first interdigital transducer of the second filter being configured to jointly output a filtered signal.

According to another embodiment there is provided a terminal comprising the filter circuits as described above.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments." "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures:

FIG. 7 is a plot showing delay time of the Lamb wave filter according to FIG. 6;

FIG. 15 is a block diagram of one example of a front-end module that can include one or more filter modules including Lamb wave filters according to aspects of the present disclosure; and FIG. 16 is a block diagram of one example of a wireless device including the front-end module of FIG. 15.

DETAILED DESCRIPTION

Aspects and embodiments described herein are directed to a Lamb wave filter with improved out of band rejection and with band cutting. An array of float electrodes, resembling an interdigital transducer (IDT), but without a connected potential, are used to provide an acoustic band gap (BG) within or adjacent to the passband of a Lamb wave filter. This provides a high Q (quality) rejection of out of band signals, without any interference with the delay time of the propagation of signals across the filter. Furthermore, as this device can use the SO wave mode, the filter can be used in high frequency applications (over 10 GHz).

Figure 1:
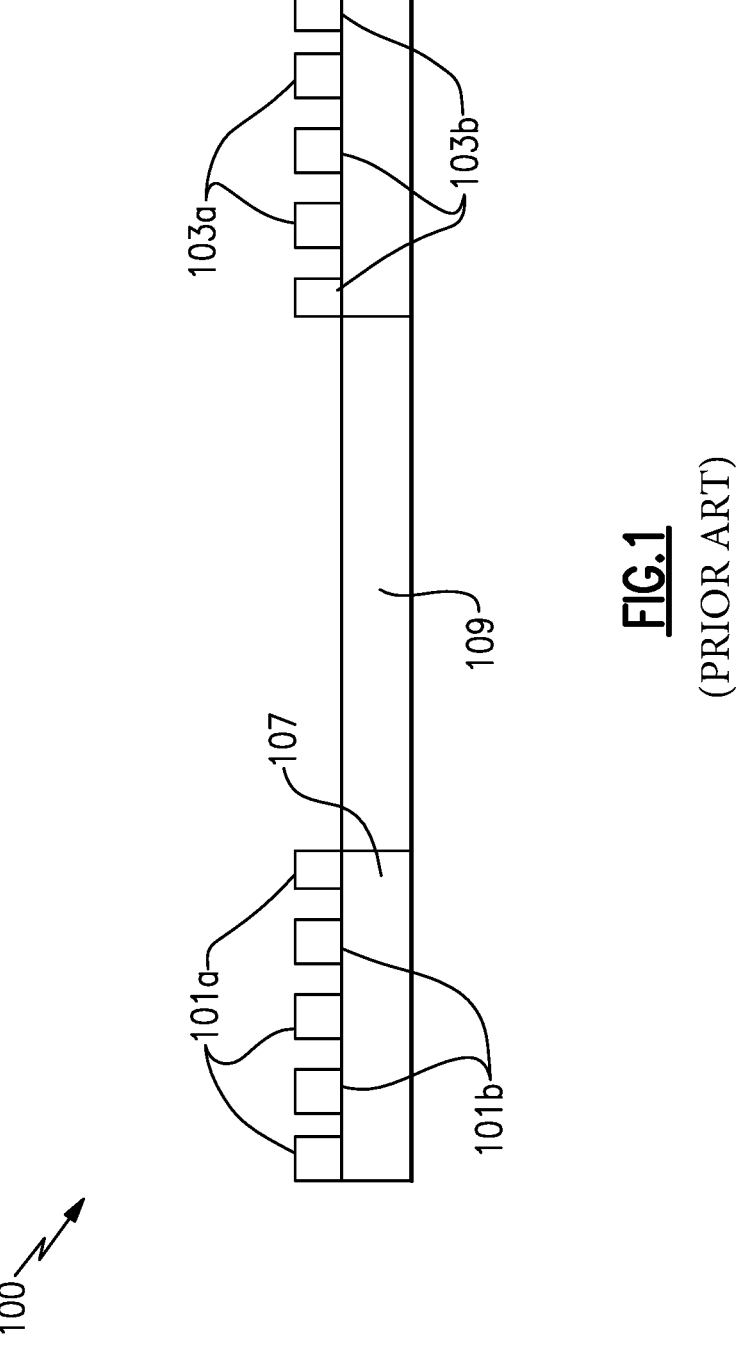
FIG. 1 is a prior art Lamb wave filter.

FIG. 1 shows a prior art Lamb wave filter 100 having a conventional construction, and conventional out of band rejection (which will be discussed with reference to FIG. 2). The filter comprises a thin substrate 107, 109, which can be made from aluminum nitride, or other suitable materials such as silicon doped aluminum nitride, zinc oxide, lithium niobate, or any other piezoelectric material. Disposed at either end of the thin substrate in regions 107 is an IDT, manufactured from aluminum, or other suitable metals such as tungsten, copper, gold, silver, platinum, ruthenium, molybdenum, or iridium. One IDT comprises a first set of fingers, or electrodes, 101a connected to a signal input and a second set of fingers, or electrodes, 101b connected to ground. The other IDT comprises a first set of fingers, or electrodes, 103a which provides a filtered output of the input signal and second set of fingers, or electrodes, 103b which are connected to ground. Instead of ground, the second sets of fingers 101b and 103b can be connected to the opposite side of the signal input, i.e., the first IDT could be connected to a signal input which is not connected to ground. The Lamb wave filter 100 has a set of filter characteristics which are provided by the number of IDTs, their spacing between sets of fingers and distance from one another.

Figure 2:
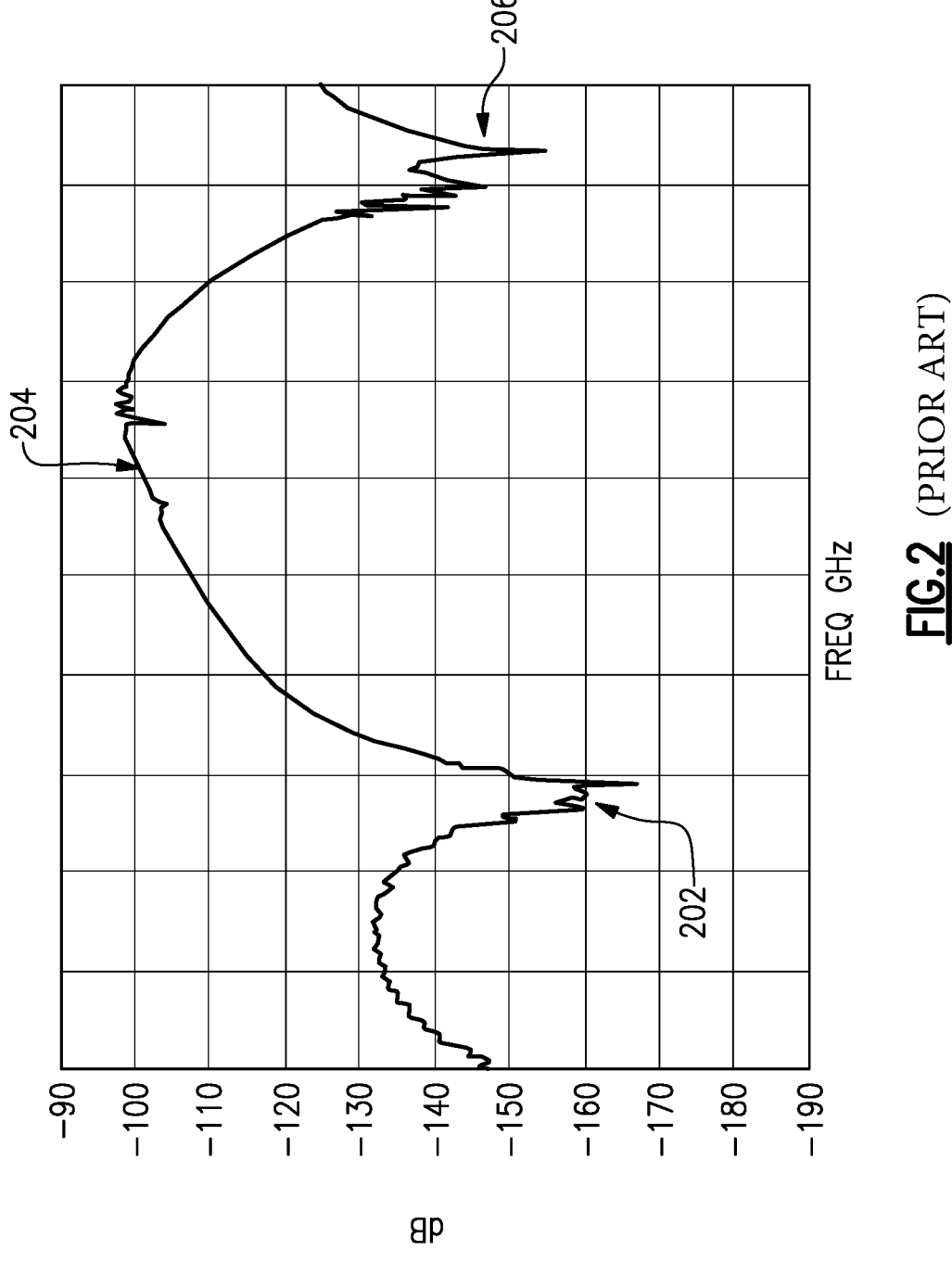
FIG. 2 is a plot showing the out of band rejection for the prior art Lamb wave filter.

FIG. 2 shows a plot 200 which provides a representation of the passband of the Lamb wave filter 100. It can be seen that the out of band rejection 202 at the lower end of the passband is slim, badly formed, and tails off on either side. This means that the rejection of the signal 204 at this point is not suitable for high accuracy applications. Furthermore, it can also be seen that the out of band rejection 206 at the upper end of the passband is also badly formed, not attenuated to the same level as the out of band rejection 202, and tails off on either side. As with the out of band rejection 202 this is not suitable for high capacity radio frequency applications where different channels are close to one another.

Lastly, it can be seen that the entire width of the passband comprises a single channel, and as such only one channel can be filtered using this filter 100.

Figure 3:
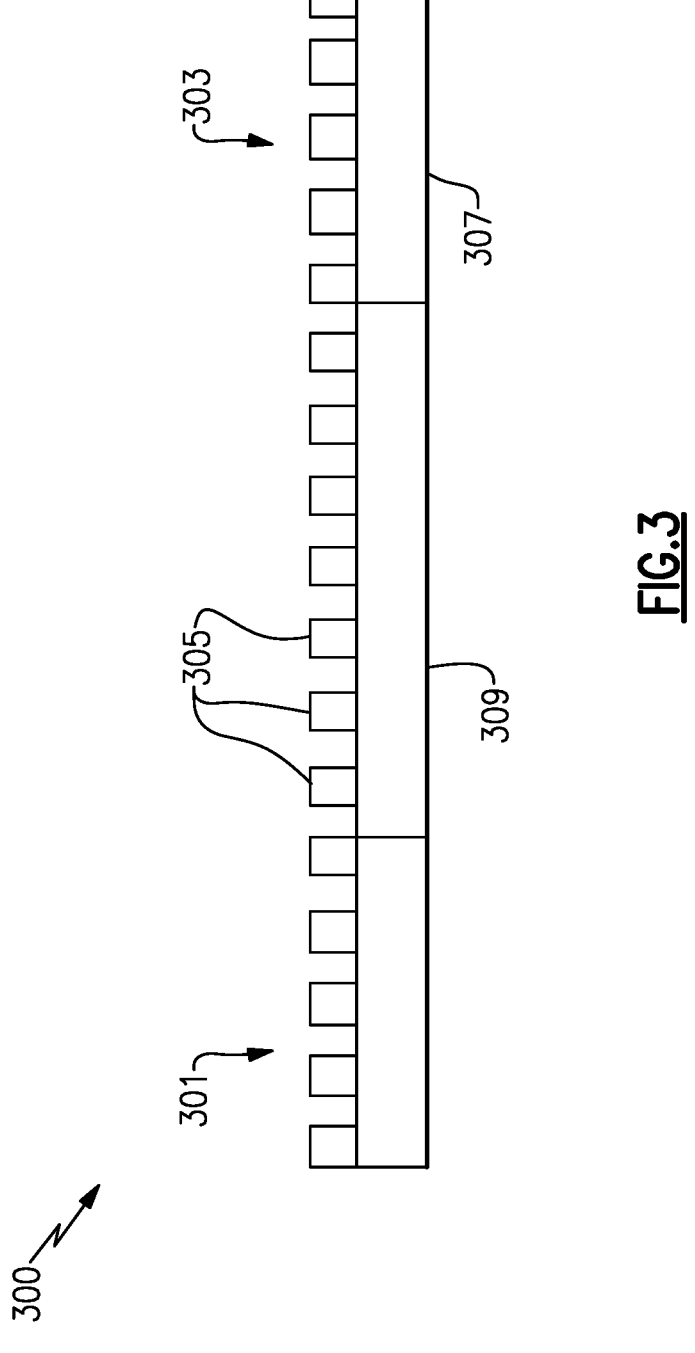
FIG. 3 is a Lamb wave filter with improved out of band rejection according to aspects of the present disclosure.

FIG. 3 shows a Lamb wave filter 300 with improved out of band rejection, according to aspects of the present disclosure. In addition to the components of the Lamb wave filter 100, such as the IDT 301, IDT 303, center region 309 and edge regions 307, there is a central array of floating electrodes 305 disposed on the center region 309. The center electrodes 305 are referred to as floating, as unlike IDTS 301 and 303, they do not have a connected potential, or are connected to ground to reduce EM interference between multiple filters in a module.

Figure 5:
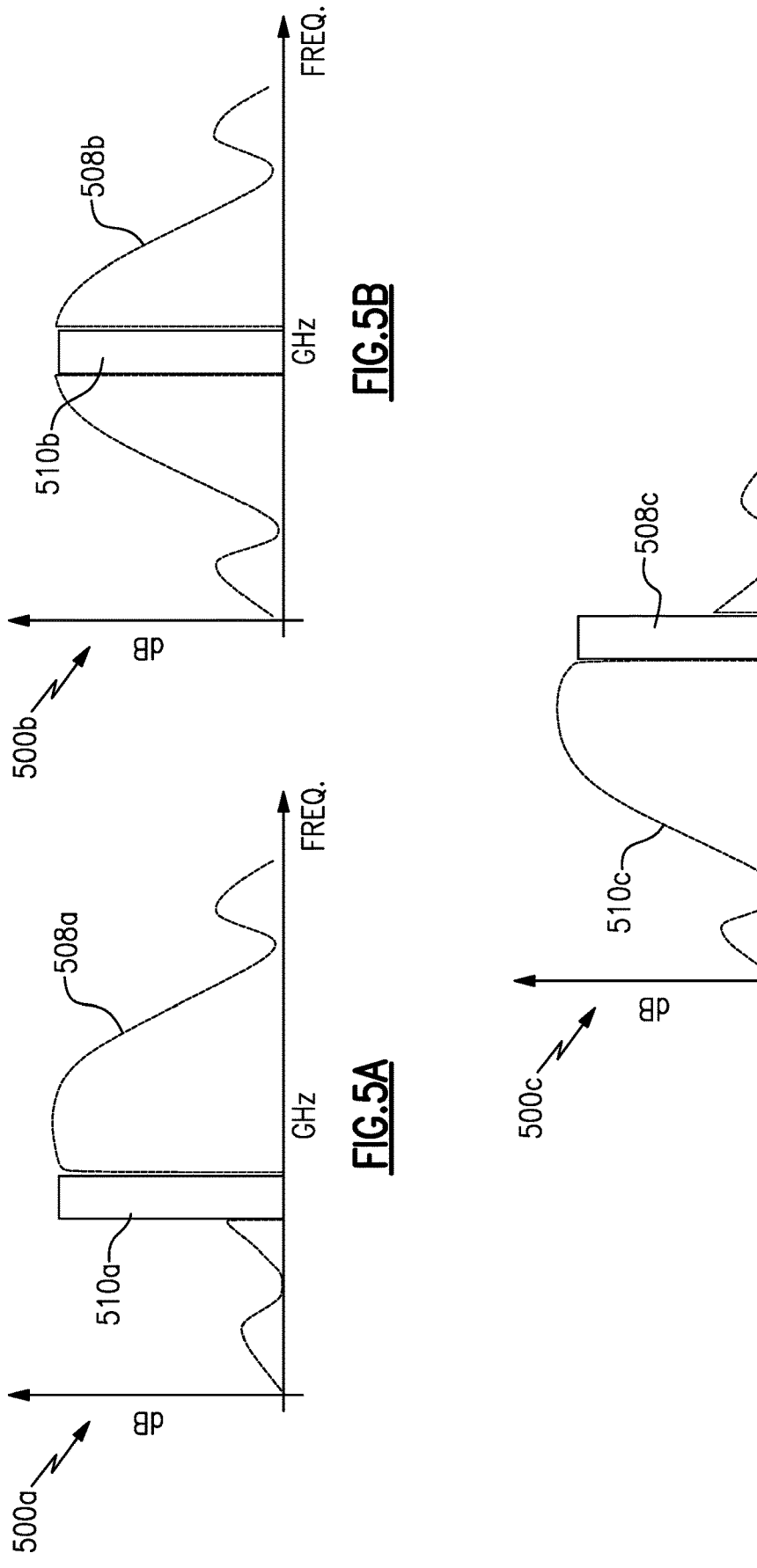
FIG. 5A is an exemplary low frequency out of band rejection plot for the Lamb wave filter with improved out of band rejection according to aspects of the present disclosure.
FIG. 5B is an exemplary mid frequency out of band rejection plot for the Lamb wave filter with improved out of band rejection according to aspects of the present disclosure.
FIG. 5C is an exemplary high frequency out of band rejection plot for the Lamb wave filter with improved out of band rejection according to aspects of the present disclosure.

The center electrodes 305 are so placed as to provide a band gap, where the Lamb wave filter 300 will not be able to pass a frequency which would otherwise be partly or wholly within the passband of the filter 300. In general terms, the passband is controlled by the number of fingers in the IDTs 301 and 303. This set of center electrodes 305 can be arranged to provide a band gap wherever it is desired as will be discussed with reference to FIG. 5. To tune the Lamb wave filter 300, there are certain parameters regarding the number of electrodes in the IDTs and the center electrodes in the center region which can be adjusted. The impedance of the input IDT 301 and the output IDT 303 can be the same, however this is not critical. The number of center electrodes 305 in the center region 309 should be greater than the number of electrodes in each IDT 301 or 303 to effectively provide the band gap structure. This is because if the same number of electrodes are present in the IDT and the center region 309 the entire passband of the filter 300 will be rejected, and because the greater the number of electrodes 305 in the center region 309, the smaller the band gap will eventually be. The pitch of the electrodes 305 can be adjusted to change the resonant frequency of the band gap, and so this can be used to place the band gap at certain positions within the passband.

Figure 4:
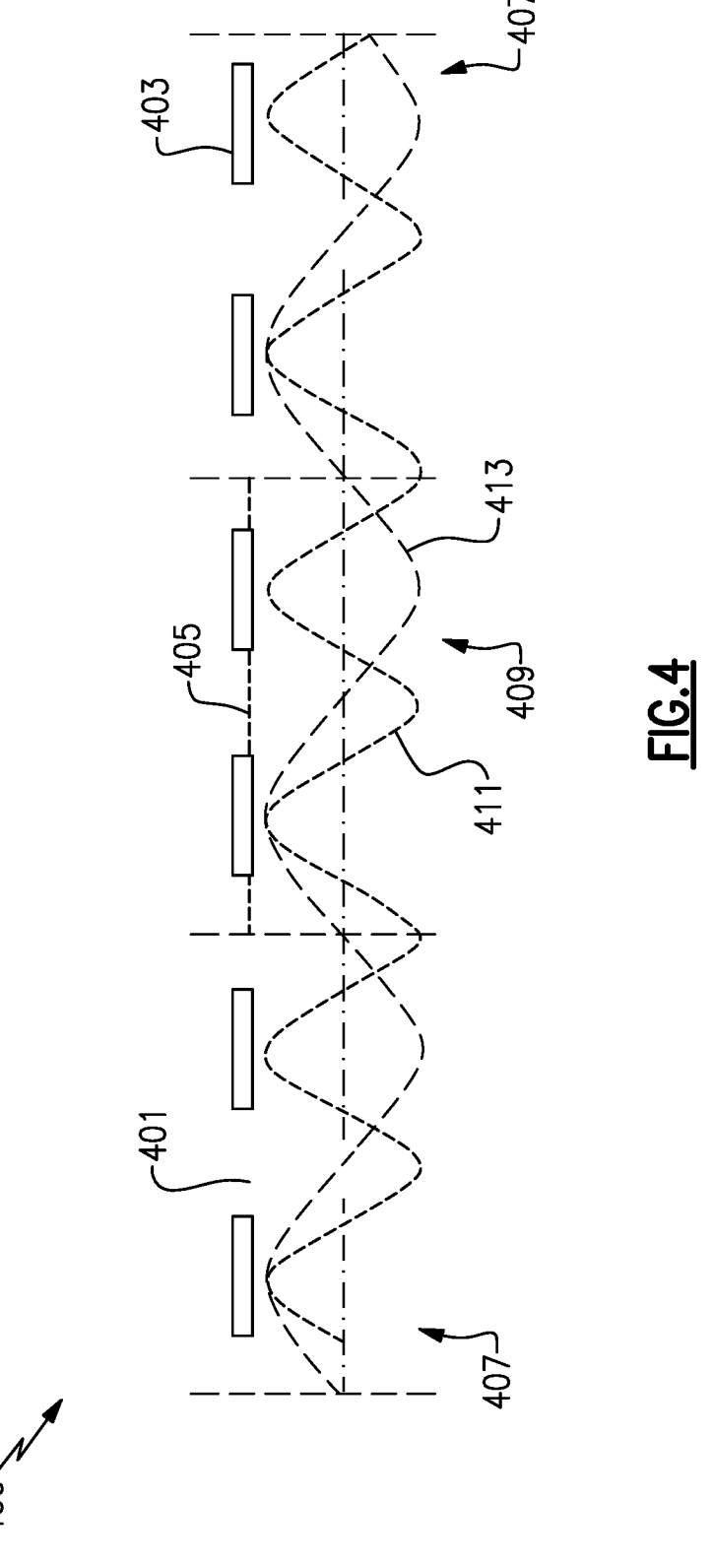
FIG. 4 shows the propagation of waves through a Lamb wave filter with improved out of band rejection according to aspects of the present disclosure.

The center electrodes 305 also have the benefit of reducing interference at the IDT 301 caused by multiple reflection from the IDT 303, which in the presently discussed examples occurs when the number of electrodes in the IDTs 301 and 303 is equal to or fewer than 16. In the presently discussed example, the IDTs each have 20 or fewer electrodes. Different numbers of electrodes may be used for different implementations, however. FIG. 4 shows a representative Lamb wave filter 400 with improved out of band rejection and demonstrates how Lamb waves propagate within the thin substrate 407, 409, according to aspects of the present disclosure. The filter 400 has IDTs 401 and 403 and center electrodes 405. The wave 411 is the S0 wave, the lowest frequency symmetric Lamb wave of the filter 400, and the wave 413 is the A0, the lowest frequency asymmetric Lamb wave of the filter 400. As noted above, the Lamb wave filter 300, 400 can use the S0 wave, meaning that it can be used at much higher frequencies than if the A0 wave mode is used. In particular, it can be seen that the S0 wave mode 411 has more than double the frequency of the A0 wave mode 413. FIG. 4 also highlights that the wave is contained within the substrate, whereas the center electrodes 405 are disposed atop the substrate. This ensures that there is very low propagation loss within the Lamb wave filter according to an aspect of the present disclosure.

FIG. 5A shows a plot 500a, with attenuation on the y axis and frequency on the x axis, representative of a Lamb wave filter 300 with improved out of band rejection, where the band gap 510a is placed at the beginning, low frequency side, of the pass band illustrated by line 508a. This can be achieved by setting the pitch of the center electrodes 305 of the filter 300 to be greater than the pitch of the IDT electrodes 301 and 303. For instance, this could be achieved by setting the pitch of the IDT electrodes 301 and 303 to between 1.1 μm and 1.3 μm, or to about 1.2 μm, and the pitch of the center electrodes 305 to between 1.3 μm and 1.4 μm, or to about 1.37 μm. The Lamb wave filter 300 may, depending on its application, operate between 100 MHz to 20 GHZ, and the pitch of the center electrodes can be varied from around 0.5 μm to around 100 μm accordingly.

This is therefore useful where there are close sets of signals transmitted around the low frequency end of the passband of the filter 300. Because the out of band rejection is improved, it is possible to exclude signals transmitted from frequencies neighboring the passed signal.

FIG. 5B shows a plot 500b, with attenuation on the y axis and frequency on the x axis, representative of a Lamb wave filter 300 with improved out of band rejection where the band gap 510b is placed in the center of the passband, so as to create two separate passbands for the filter 300, thereby allowing two separate channels to be passed by the same filter 300. This can be achieved by setting the pitch of the center electrodes 305 to the same as the pitch of the IDT electrodes. 301, 303. For instance, this could be achieved by setting the pitch of the IDT electrodes 301 and 303 to between 1.1 μm and 1.3 μm, or to about 1.20 μm, and the pitch of the center electrodes 305 to between 1.1 μm and 1.3 μm, or to about 1.20 μm.

This greatly improves the utility of the Lamb wave filter 300, because this allows channels to be sent which are closer together, improving the bandwidth of a signal system. It also allows one filter to provide both channels, reducing the amount of components needed to handle both channels.

FIG. 5C shows a plot 500c, with attenuation on the y axis and frequency on the x axis, representative of a Lamb wave filter 300 with improved out of band rejection where the band gap 508c is placed at the end, high frequency side, of the pass band illustrated by line 510*c*. This can be achieved by setting the pitch of the center electrodes 305 of the filter 300 less than the pitch of the IDT electrodes 301 and 303. For instance, this could be achieved by setting the pitch of the IDT electrodes 301 and 303 to between 1.1 μm and 1.3 μm, or to about 1.2 μm, and the pitch of the center electrodes 305, to between 1 μm and 1.1 μm, or to about 1.07 μm.

This is useful where there are close sets of signals transmitted around the high frequency end of the passband of the filter 300. Because the out of band rejection is improved, it is possible to exclude signals transmitted from neighboring frequencies from the passed signal.

All of these exemplary pitches also use a duty factor of 0.5, meaning that the gap between electrodes 301, 303, 305 is the same as the width of each electrode.

Figure 6:
FIG. 6 is a plot showing the out of band rejection for a center band gap Lamb wave filter according to aspects of the present disclosure.

FIG. 6 shows results of a simulation 600, with attenuation on the y axis and frequency on the x axis, which provides a simulated representation of the passband of the Lamb wave filter 300, if the electrodes of the IDTs 301 and 303 and the center electrodes 305 are set to the same pitch. It can be seen that the out of band rejection 602 is the same as with the plot 200, and it can also be seen that the out of band rejection 604 at the high end of the passband is also the same as in the plot 200. However, the passband has now been bisected with an attenuation of around 60 dB to provide two separate channels. As noted above with respect to plot 500*b*, this allows for much greater utility of the Lamb wave filter 300. In the prior art Lamb wave filters, such as the filter 100, it is very difficult to achieve more than 40 dB rejection, however the improved Lamb wave filter 300 it is easy to achieve more than 60 dB rejection.

For this representative example, the pitch of all electrodes is 1.20 μm, and the duty factor is 0.5. The thin substrate is 0.32 thick (0.3 wavelengths of the signal) and the IDT's are 0.032 thick.

FIG. 7 shows results of a simulation 700, with time on the y axis and frequency on the x axis, which provides a simulated representation of the delay response of the filter 300 when configured to have the bandgap shown in plot 600. It can be seen that a near constant delay response time of 25 ns (nanoseconds) is present throughout the passband of the Lamb wave filter 300, i.e., between the low 702 and high 706 edges of the pass band, other than slight increases to 40.0 ns in the area immediately adjacent to the bandgap 704. This shows that the response of the Lamb wave filter is largely consistent and two separate channels can be produced using one filter 300.

The delay time or response is the physical time that the Lamb wave takes to propagate through the Lamb wave filter 300, or indeed any Lamb wave filter. With reference to FIG. 3, the waves are set up by the first IDT 301, and then propagate through the central region 309 to be received by the second IDT 303. Thus, it could be expected that by placing a set of center electrodes 305 in the central region 309 that a further and unpredictable propagation delay could be introduced. Indeed, at the bandgap, which is formed by the center electrodes 305, there is a slight increase, however this is not material to the operation of the device, and as discussed above, two separate fully functioning channels are provided by the Lamb wave filter, as shown between the two sets of dotted lines.

Figures 8A, 8B:
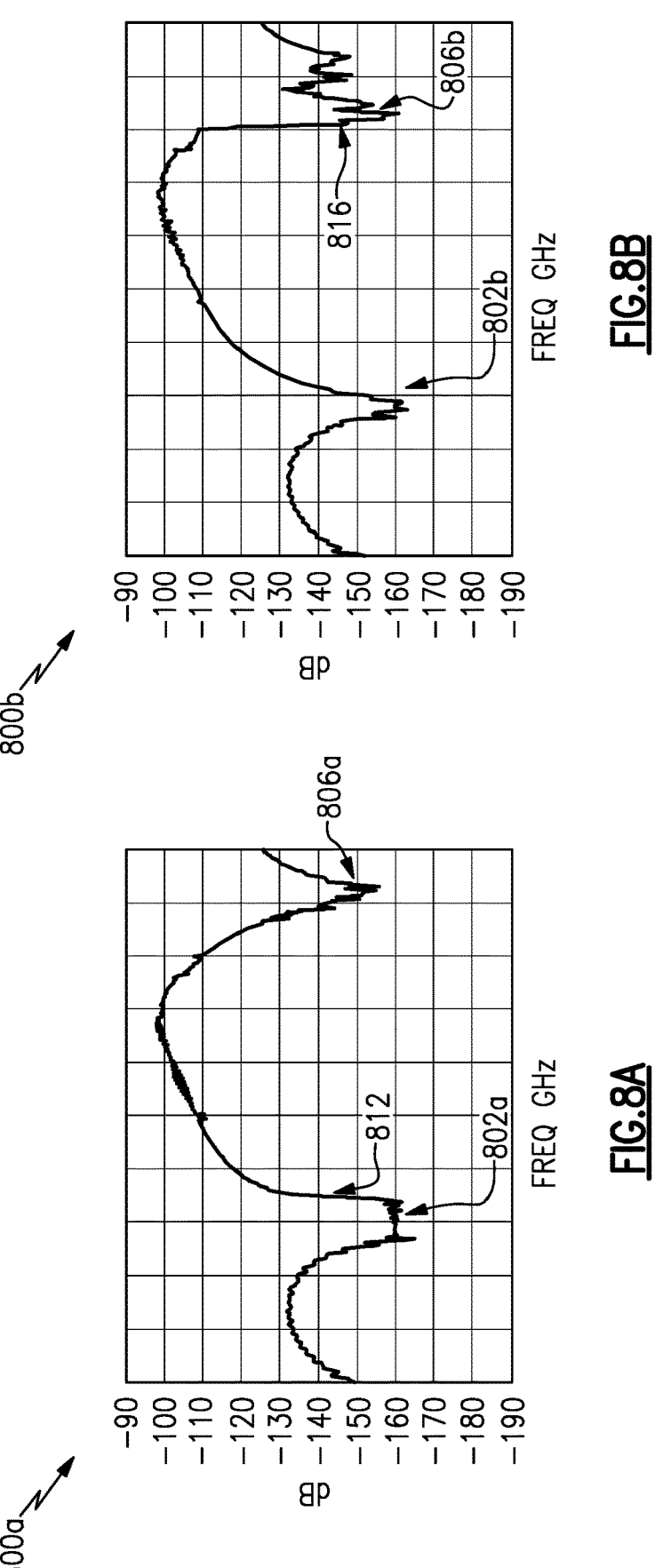
FIG. 8A is a plot showing the out of band rejection for a low band gap Lamb wave filter according to aspects of the present disclosure.
FIG. 8B is a plot showing the out of band rejection for a high band gap Lamb wave filter according to aspects of the present disclosure.

FIGS. 8A and 8B show results of example simulations, with attenuation on the y axis and frequency on the x axis, of the frequency response of Lamb wave filter 300 when set up as per the graphs of 500*a* and 500*c* respectively, as shown in FIGS. 5A and 5C.

For the representative simulation 800*a* of FIG. 8A the pitch of the IDT electrodes is 1.20 μm, the pitch of the center electrodes 305 is 1.37 μm, and the duty factor is 0.5. The thin substrate is 0.3λ thick (0.3 wavelengths) and the IDT's are 0.03λ thick. This, similar to the graph 500*a*, provides a Lamb wave filter which has a sharp, large cutoff 802*a* at the low end of the passband. There is a pronounced step 812 from the bandgap 802*a* into the passband of the Lamb wave filter 300. This ensures that frequencies from neighboring signals at the low end of the passband are robustly excluded, and the response to the filter frequency is better. The response at the high end of the passband 806*a* is largely unchanged compared to the conventional Lamb wave filter 100.

For the representative simulation 800*b* of FIG. 8B the pitch of the IDT electrodes is 1.20 μm, the pitch of the center electrodes 305 is 1.07 μm, and the duty factor is 0.5. The thin substrate is 0.32 thick (0.3 wavelengths) and the IDTs are 0.032 thick. The thin substrate can be between 0.1 to 1 wavelengths in thickness, and the IDTs may be 0.01 to 0.5 wavelengths thick. This, similar to the graph 500*c*, provides a Lamb wave filter which has a sharp, large cutoff 806*b* at the high end of the passband. There is a pronounced drop 816 from the passband of the Lamb wave filter 300 into the bandgap 806*b*. This ensures that frequencies from neighboring signals at the high end of the passband are robustly excluded, and the response to the filter frequency is better. The response at the low end of the passband 802*b* is largely unchanged compared to the conventional Lamb wave filter 100.

Figure 9B:
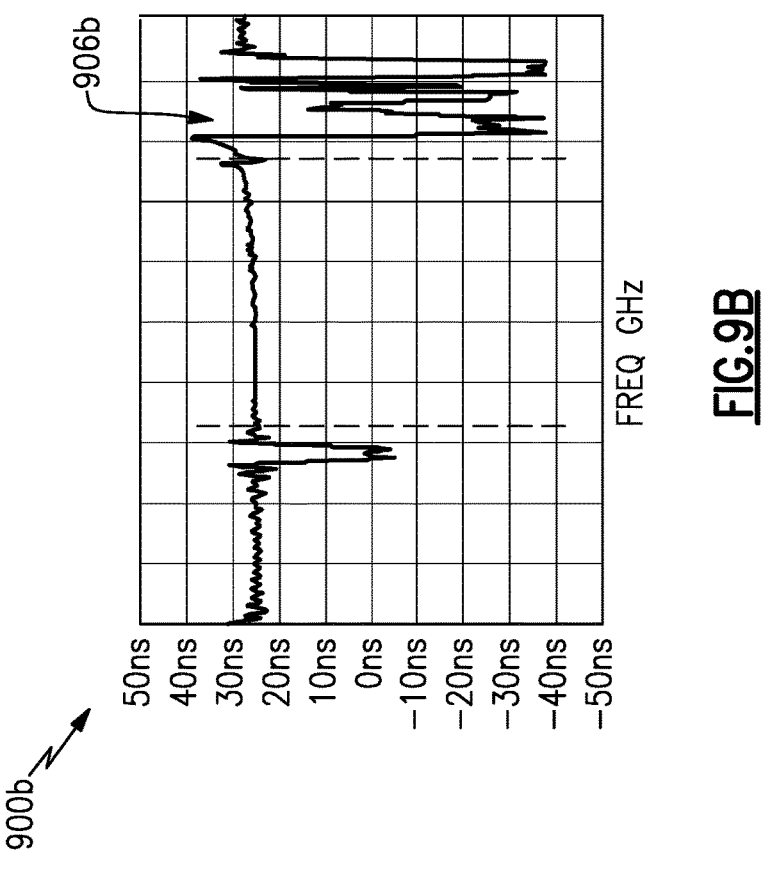
FIG. 9B is a plot showing delay time of the Lamb wave filter according to FIG. 8B.
Figure 9A:
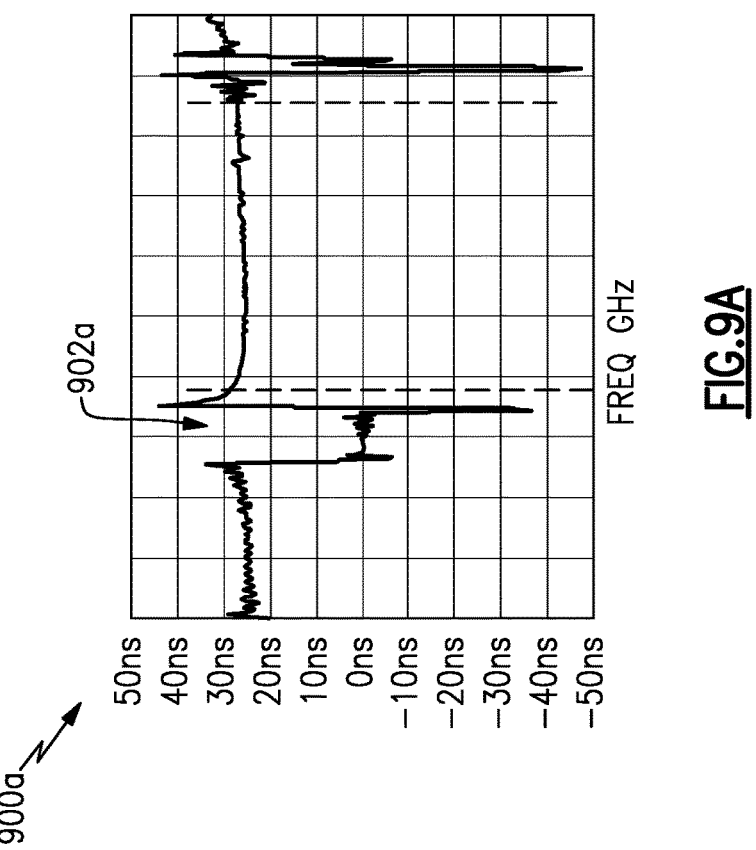
FIG. 9A is a plot showing delay time of the Lamb wave filter according to FIG. 8A.

FIGS. 9A and 9B shows results of example simulations, with time on the y axis and frequency on the x axis, of the delay response of the Lamb wave filter 300 when set up as per the graphs 800*a* and 800*b* respectively, as shown in FIGS. 8A and 8B.

The simulation 900*a* of FIG. 9A shows the delay response which coordinates with the Lamb wave filter 300 set up as described with reference to FIG. 8A above. It can be seen that there is only a small increase in propagation delay after the bandgap 902*a*, and other than this, and the desired rejected portion 902*a*, propagation delay of the Lamb wave filter 300 is not affected by the center electrodes 305, as with the example of FIG. 7. This can be seen in the wide passband area denoted between the dotted lines where the delay response is substantially stable. Similarly, the simulation 900*b* of FIG. 9B shows the delay response which coordinates with the Lamb wave filter 300 set up as described with reference to FIG. 8B above. It can be seen that there is only a small increase in propagation delay before the bandgap 906*b*, and other than this, and the desired rejected portion 906*b*, the propagation delay of the Lamb wave filter 300 is not affected by the center electrodes 305, as with the example of FIG. 7. This can also be seen in the wide passband area denoted between the dotted lines where delay response is substantially stable.

In the specific example described and shown above, the maximum height (i.e., thickness) of the substrate is 0.3 wavelengths, the height of each IDT electrode is 0.03 wavelengths. Other sizes and pitches, however, are useful for different implementations, in particular frequency ranges from 10 MHz to 20 GHz. A different substrate height will provide a different wave amplitude, and a different pitch and duty factor will produce a different frequency of wave. The width of each electrode can also be varied, to keep the advantageous duty factor yet increase or decrease slightly the frequency of the wave. The thickness of the electrodes in the IDT(s) can be changed, and a thicker electrode can result in an improved coupling coefficient, lower loss factor and lower electrical impedance. The thickness of the center electrodes can also be changed, where a different thickness of electrode will change the acoustic impedance and group velocity of the wave.

Examples and embodiments of Lamb wave filter devices discussed herein can be implemented in a variety of circuits arranged to provide specific passband and bandgap arrangements. Some example circuits will now be discussed in which any suitable principles and advantages of the Lamb wave filter discussed herein can be implemented. FIGS. 10A to 12B illustrate circuit diagrams and passband plots of illustrative circuits according to certain embodiments.

Not shown in these figures is a "release window" which is useful for restricting lateral leaking of Lamb waves in the center (waveguiding) region 309, and is created by etching a physical gap at the side boundaries of the center region to constrain the Lamb waves. This is not always necessary, only where there is a possibility for lateral Lamb wave leakage.

Figures 10A, 10B:
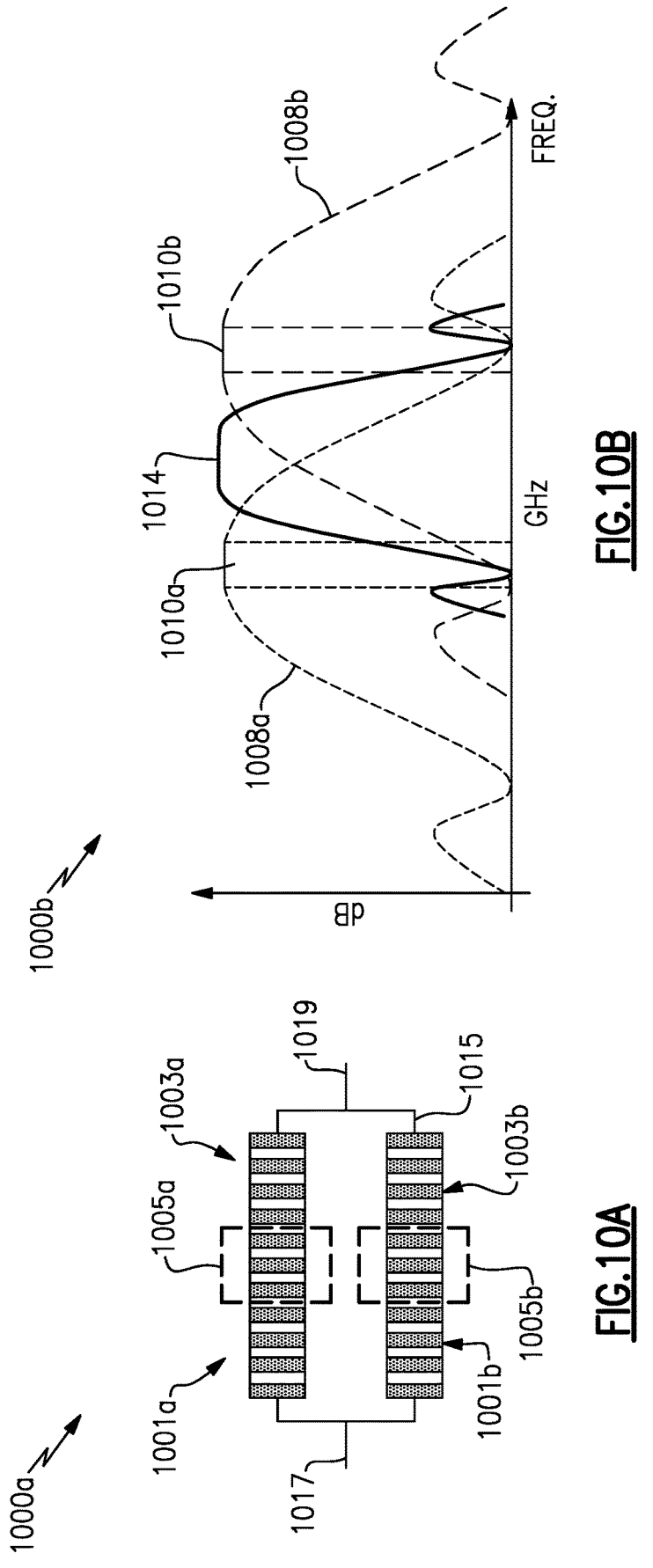
FIG. 10A is an exemplary circuit comprising two Lamb wave filters with improved out of band rejection connected in parallel.
FIG. 10B is a plot showing the out of band rejection for the circuit of FIG. 10A.

FIG. 10A shows an example circuit where two Lamb wave filters such as the Lamb wave filter 300 are connected in parallel. This means that the input 1017 is split between the first IDTs, 1001a and 1001b of each IDT, and the output 1019 is combined from both second IDTs 1003a and 1003b. The center electrodes are floating, as per the Lamb wave filter 300, and are shown in boxes 1005a and 1005b.

This arrangement allows for a robustly defined center passband filter using filters with the same relative bandgap but different passbands. As noted above, the passband of each individual filter is set by the pitch and number of electrodes in the IDTs 1001a, 1001b, 1003a, and 1003b. The bandgap of each filter is set by the pitch and number of IDTs. By using two filters with a different passband, but with the same relative bandgap, i.e., a center bandgap as illustrate in FIG. 5B, only the range of frequencies between the bandgaps is passed. The benefits of this arrangement is that there is no increased impedance loss based on the number of filters connected in parallel, particularly if the impedance of each filter is matched. Furthermore, there is no phase distortion introduced by the circuit.

FIG. 10B shows an example representation 1000b of the output according to the circuit 1000a. It can be seen that there are two center band gap regions defined 1010a and 1010b, which are set by the center electrodes 1005a and 1005b. The complete pass band of each filter is shown by lines 1008a and 1008b, and the actual resultant passband is shown by line 1014. This shows that only the band between the two bandgaps is passed by the circuit. It is possible to add further filters to then add more passbands, with the advantage being that multiple well defined passbands can be achieved by adding more filters, with the number of filters required being one more than the number of passbands.

It is noted that in the above examples using one filter, such as the examples 500a to 500c, it is not possible to sharply define both ends of the passband. This is achieved by the circuit 1000a.

Figures 11A, 11B:
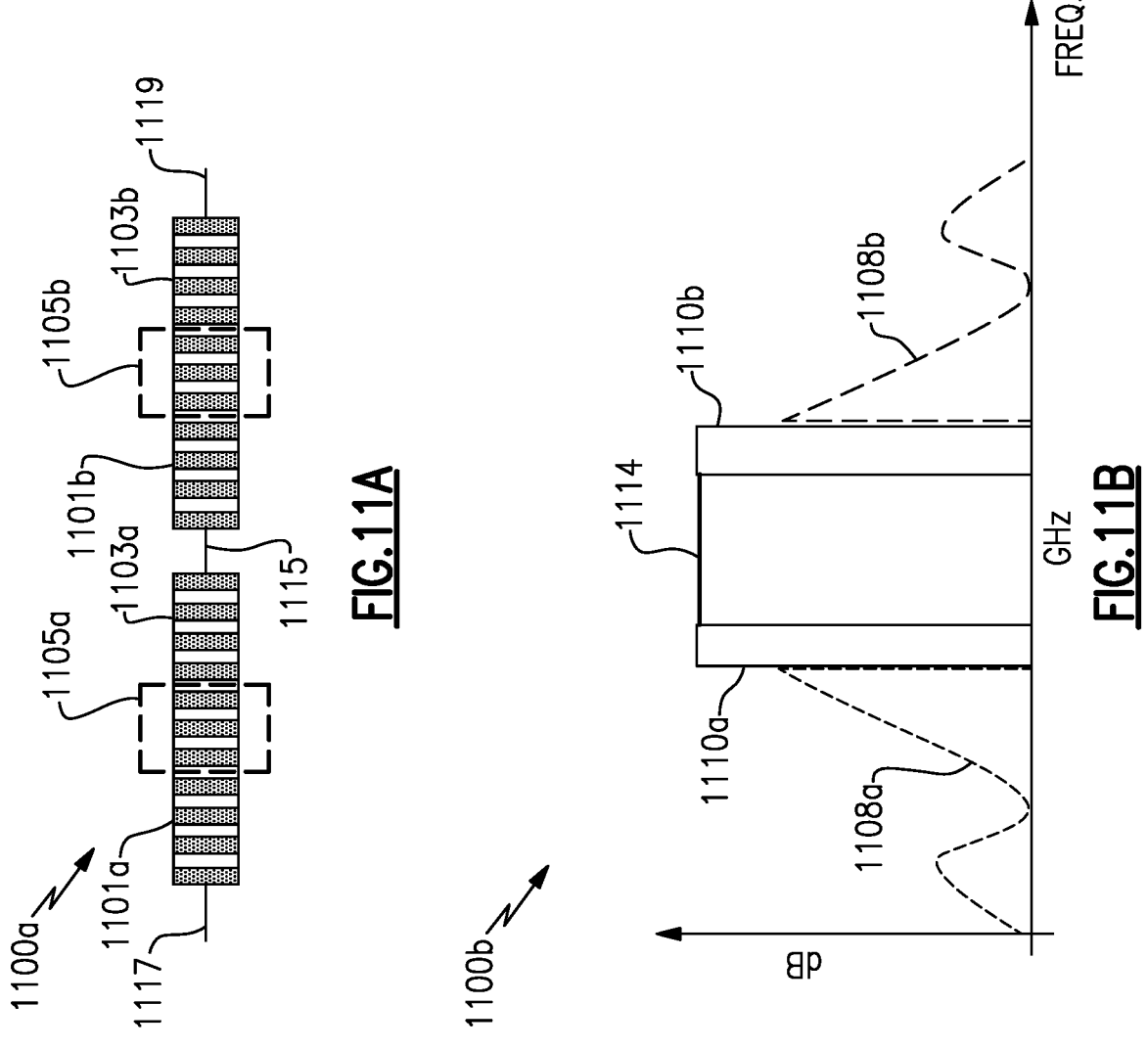
FIG. 11A is an exemplary circuit comprising two Lamb wave filters with improved out of band rejection connected in series.
FIG. 11B is a plot showing the out of band rejection for the circuit of FIG. 11A.

FIG. 11A shows an example circuit where two Lamb wave filters such as the Lamb wave filter 300 are connected in series. This means that the input 1117 is connected to the first IDT 1101a of the first filter and the output 1119 is derived from the second IDT 1103b of the second filter. The second IDT 1103a of the first filter is connected to the first IDT 1101b of the second IDT by connection 1115. The center electrodes are floating, as per the Lamb wave filter 300, and are shown in boxes 1105a and 1105b.

This arrangement also allows for a robustly defined center bandpass filter using filters with different bandgaps but the same passbands. As noted above, the passband of each individual filter is set by the pitch and number of electrodes in the IDTs 1101a, 1101b, 1103a, and 1103b. The bandgap of each filter is set by the pitch and number of IDTs. Essentially, a first set of center electrodes 1105a are tuned to provide a low end bandgap, such as in the plot 500a, and the second set of center electrodes 1105b are tuned to provide a high end bandgap. The result is a superposition of the two resultant outputs, resulting in a very high quality (lincarity) passband, which is wide and has very good out of band rejection. As the filters are placed in series, impedance loss is increased proportionally as the number of filters is increased.

FIG. 11B shows an example representation 1100b of the output according to the circuit 1100a. It can be seen that there are low end and high end band gap regions defined 1110a and 1110b, which are set by the center electrodes 1105a and 1105b. The complete pass band of each filter is shown by lines 1108a and 1108b, and the actual resultant passband is shown by line 1114. This shows that only the band between the two bandgaps is passed by the circuit. More passbands can be achieved, however, this requires different passbands of the filters and also different bandgaps.

As above it is noted that in the above examples using one filter, such as the examples 500a to 500c, it is not possible to sharply define both ends of the passband. This is also achieved by the circuit 1100a.

Figures 12A, 12B:
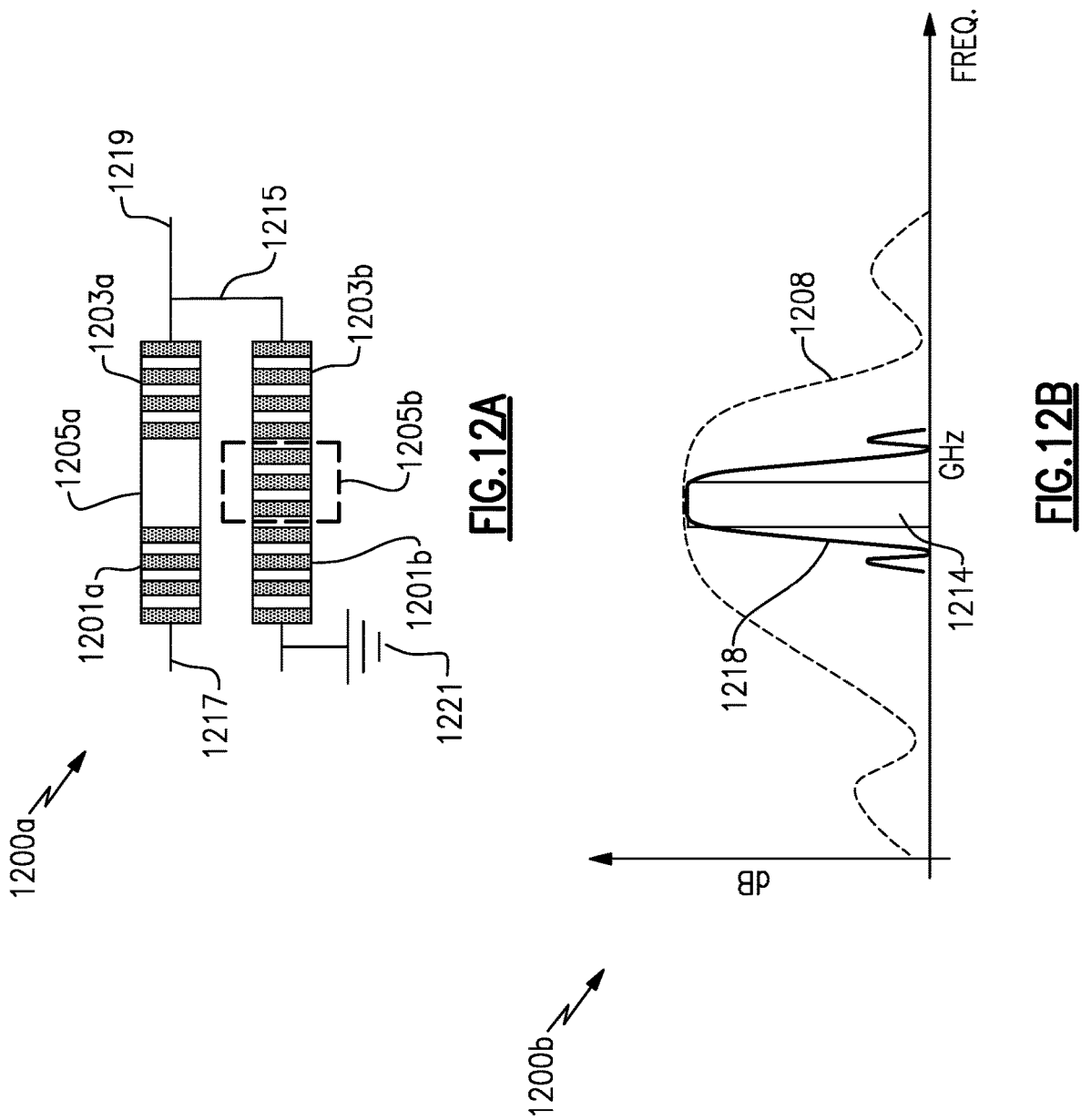
FIG. 12A is an exemplary circuit comprising two Lamb wave filters with improved out of band rejection connected in a series/parallel configuration.
FIG. 12B is a plot showing the out of band rejection for the circuit of FIG. 12A.

FIG. 12A shows an example circuit where two Lamb wave filters such as the Lamb wave filter 300 are connected in a series parallel configuration. This means that the input 1217 is connected to the first IDT 1201a of the first filter and the output 1219 is derived from a combination of the second IDT 1203a of the first filter and the second IDT 1203b of the second filter, which are connected together by connection 1215. The first IDT 1201b of the second filter is connected to ground 1221. Only the second filter has center electrodes, which are floating, as per the Lamb wave filter 300, and are shown in boxes 1205b. The region of the first electrode 1205a has no floating electrodes, and operates as a conventional Lamb wave transmission filter.

This arrangement also allows for a very narrow passband filter with high rejection. As both filters have the same passband, when the first filter passes the entire passband region, this is shunted to ground via the second filter, which will pass this same passband. The second filter, however, will reject the bandgap set by the center electrodes in the region 1205b, and so this is not shunted to ground. This means that the only output of the circuit is the bandgap region defined by the center electrodes 1205b of the second filter. Essentially, this provides an output reversed from that which would result from simply using the second filter as described above with reference to FIG. 5B. This means that the bandgap range is passed, and the passband range is rejected. This results in a very narrow passband filter circuit with high out of band rejection, which provides the possibility to develop multichannel RF devices with very narrow transmission channels and high capacity of channels.

FIG. 12B shows an example representation 1200b of the output according to the circuit 1200a. It can be seen that only the wave 1218 defined by the center bandgap 1214, in turn defined by the electrodes 1205b, is passed. The wave 1208 is the output from the first filter, and is not passed (attenuated).

Figure 13:
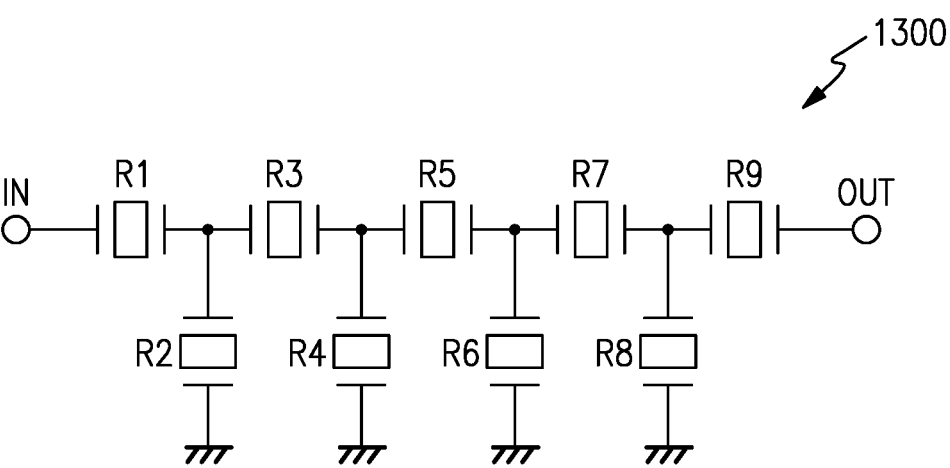
FIG. 13 shows an example of a ladder filter in which multiple Lamb wave filters according to aspects of the present disclosure may be combined.

FIG. 13 shows an example of a filter 1300 in which multiple Lamb wave filters as disclosed herein may be combined. FIG. 13 shows an RF ladder filter 1300 including a plurality of series Lamb wave filters R1, R3, R5, R7, and R9, and a plurality of parallel (or shunt) Lamb wave filters R2, R4, R6, and R8. As shown, the plurality of series Lamb wave filters R1, R3, R5, R7, and R9 are connected in series between the input and the output of the RF ladder filter, and the plurality of parallel Lamb wave filters R2, R4, R6, and R8 are respectively connected between series Lamb wave filters and ground in a shunt configuration. Other filter structures and other circuit structures known in the art that may include Lamb wave filters, for example, duplexers, switchers, delay lines, fractional differentiators, modulators, etc., may also be formed including examples of Lamb wave filters disclosed herein.

Figure 14:
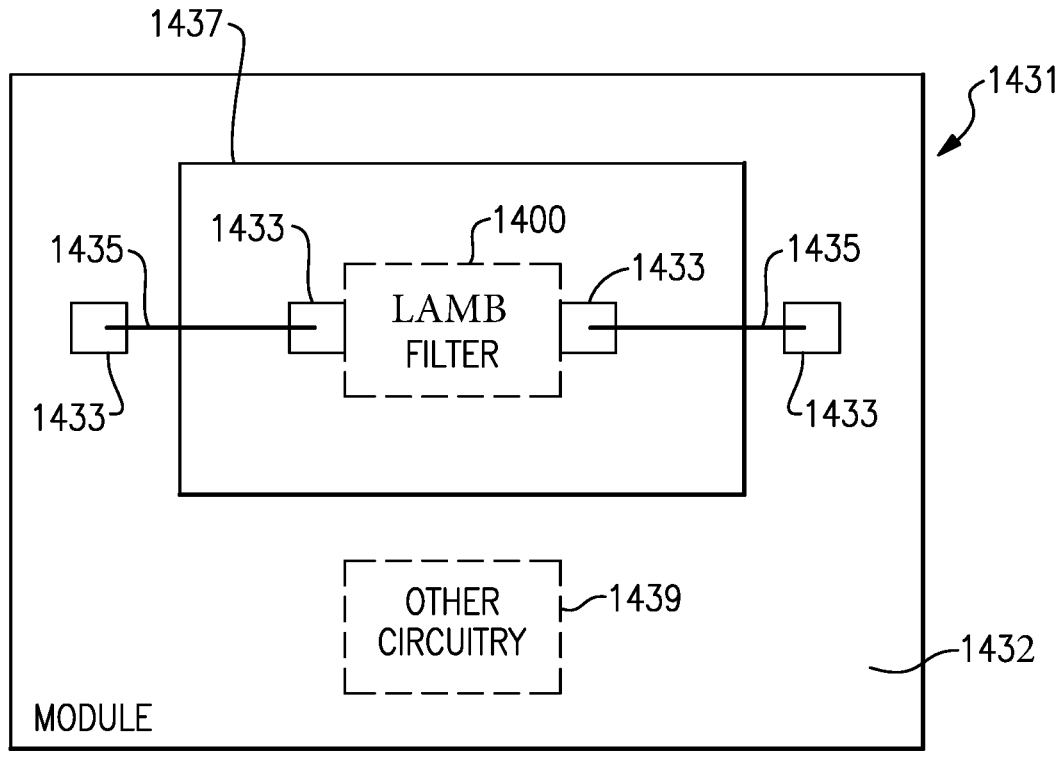
FIG. 14 is a block diagram of one example of a filter module that can include one or more Lamb wave filters according to aspects of the present disclosure.

Moreover, examples and embodiments of Lamb wave filter devices discussed herein can be implemented in a variety of packaged modules. Some example packaged modules will now be discussed in which any suitable principles and advantages of the Lamb wave filter devices discussed herein can be implemented. FIGS. 14, 15, and 16 are schematic block diagrams of illustrative packaged modules and devices according to certain embodiments.

Lamb wave filters, such as those of FIGS. 3 and 10A to 12B may be incorporated into and packaged as a module that may ultimately be used in an electronic device, such as a wireless communications device, for example. FIG. 14 is a block diagram illustrating one example of a module 1431 including Lamb wave filter 1400. The Lamb wave filter 1400 may be implemented on one or more die(s) 1437 including one or more connection pads 1433. For example, the Lamb wave filter 1400 may include a connection pad 1433 that corresponds to an input contact for the Lamb wave filter and another connection pad 1433 that corresponds to an output contact for the Lamb wave filter. The packaged module 1431 includes a packaging substrate 1432 that is configured to receive a plurality of components, including the die 1437. A plurality of connection pads 1433 can be disposed on the packaging substrate 1432, and the various connection pads 1433 of the Lamb wave filter die 1437 can be connected to the connection pads 1433 on the packaging substrate 1432 via electrical connectors 1435, which can be solder bumps or wirebonds, for example, to allow for passing of various signals to and from the Lamb wave filter 1400. The module 1431 may optionally further include other circuitry die 1439, for example, one or more additional filter(s), amplifiers, pre-filters, modulators, demodulators, down converters, and the like, as would be known to one of skill in the art of semiconductor fabrication in view of the disclosure herein. In some embodiments, the module 1431 can also include one or more packaging structures to, for example, provide protection and facilitate easier handling of the module 1431. Such a packaging structure can include an overmold formed over the packaging substrate 1432 and dimensioned to substantially encapsulate the various circuits and components thereon.

Various examples and embodiments of the Lamb wave filter 1400 can be used in a wide variety of electronic devices. For example, the Lamb wave filter 1400 can be used in an antenna duplexer, which itself can be incorporated into a variety of electronic devices, such as RF front-end modules and communication devices.

Referring to FIG. 15, there is illustrated a block diagram of one example of a front-end module 1540, which may be used in an electronic device such as a wireless communications device (e.g., a mobile phone) for example. The front-end module 1540 includes an antenna duplexer 1550 having a common node 1541, an input node 1545, and an output node 1547. An antenna 1560 is connected to the common node 1541.

The antenna duplexer 1550 may include one or more transmission filters 1500a connected between the input node 1545 and the common node 1541, and one or more reception filters 1500b connected between the common node 1541 and the output node 1547. The passband(s) of the transmission filter(s) are different from the passband(s) of the reception filters. Examples of the Lamb wave filter 1400 can be used to form the transmission filter(s) 1500a and/or the reception filter(s) 1500b. An inductor or other matching component 1543 may be connected at the common node 1541.

The front-end module 1540 further includes a transmitter circuit 1549 connected to the input node 1545 of the duplexer 1550 and a receiver circuit 1551 connected to the output node 1547 of the duplexer 1550. The transmitter circuit 1549 can generate signals for transmission via the antenna 1560, and the receiver circuit 1551 can receive and process signals received via the antenna 1560. In some embodiments, the receiver and transmitter circuits are implemented as separate components, as shown in FIG. 15, however, in other embodiments these components may be integrated into a common transceiver circuit or module. As will be appreciated by those skilled in the art, the front-end module 1540 may include other components that are not illustrated in FIG. 15 including, but not limited to, switches, electromagnetic couplers, amplifiers, processors, and the like.

FIG. 16 is a block diagram of one example of a wireless device 1600 including the antenna duplexer 1650 shown in FIG. 15. The wireless device 1600 can be a cellular phone, smart phone, tablet, modem, communication network or any other portable or non-portable device configured for voice or data communication. The wireless device 1600 can receive and transmit signals from the antenna 1660. The wireless device includes an embodiment of a front-end module 1654 similar to that discussed above with reference to FIG. 15. The front-end module 1654 includes the duplexer 1650, as discussed above. In the example shown in FIG. 16 the front-end module 1654 further includes an antenna switch 1653, which can be configured to switch between different frequency bands or modes, such as transmit and receive modes, for example. In the example illustrated in FIG. 16, the antenna switch 1653 is positioned between the duplexer 1650 and the antenna 1660; however, in other examples the duplexer 1650 can be positioned between the antenna switch 1653 and the antenna 1660. In other examples the antenna switch 1653 and the duplexer 1650 can be integrated into a single component.

The front-end module 1654 includes a transceiver 1652 that is configured to generate signals for transmission or to process received signals. The transceiver 1652 can include the transmitter circuit 1649, which can be connected to the input node of the duplexer 1650, and the receiver circuit 1651, which can be connected to the output node of the duplexer 1650, as shown in the example of FIG. 15.

Signals generated for transmission by the transmitter circuit 1649 are received by a power amplifier (PA) module 1655, which amplifies the generated signals from the transceiver 1652. The power amplifier module 1655 can include one or more power amplifiers. The power amplifier module 1655 can be used to amplify a wide variety of RF or other frequency-band transmission signals. For example, the power amplifier module 1655 can receive an enable signal that can be used to pulse the output of the power amplifier to aid in transmitting a wireless local area network (WLAN)

signal or any other suitable pulsed signal. The power amplifier module 1655 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 1655 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 16, the front-end module 1654 may further include a low noise amplifier (LNA) module 1657, which amplifies received signals from the antenna 1660 and provides the amplified signals to the receiver circuit 1651 of the transceiver 1652.

The wireless device 1600 of FIG. 16 further includes a power management sub-system 1653 that is connected to the transceiver 1652 and manages the power for the operation of the wireless device 1600. The power management system 1653 can also control the operation of a baseband sub-system 1657 and various other components of the wireless device 1600. The power management system 1653 can include, or can be connected to, a battery (not shown) that supplies power for the various components of the wireless device 1600. The power management system 1653 can further include one or more processors or controllers that can control the transmission of signals, for example. In one embodiment, the baseband sub-system 1657 is connected to a user interface 1659 to facilitate various input and output of voice and/or data provided to and received from the user. The baseband sub-system 1657 can also be connected to memory 1655 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHZ, such as in a range from about 500 MHz to 3 GHZ.

As well as the individual Lamb wave filter 300, any of the circuits 1000a, 1100a, 1200a, can be implemented as the filter of any of the above examples with reference to FIGS. 13 to 16.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an car piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A circuit comprising:
   a first Lamb wave filter including a substrate having a center region and two edge regions and configured to propagate a first Lamb wave within, a first set of electrodes arranged as a first interdigital transducer disposed on one of the two edge regions and configured to receive an input signal, a second set of electrodes arranged as a second interdigital transducer disposed on the other of the two edge regions and configured to provide a filtered output signal, and a third set of electrodes disposed parallel to the first and second sets of electrodes on the center region of the substrate; and
   a second Lamb wave filter including a second substrate having a second center region and two second edge regions and configured to propagate a second Lamb wave within, a fourth set of electrodes arranged as a third interdigital transducer disposed on one of the two second edge regions and configured to receive an input signal, a fifth set of electrodes arranged as a fourth interdigital transducer disposed on the other of the two second edge regions and configured to provide a filtered output signal, and a sixth set of electrodes disposed parallel to the fourth and fifth sets of electrodes on the second center region of the second substrate, the first filter and the second filter connected in parallel such that the first set of electrodes of the first filter is connected to the fourth set of electrodes of the second filter, and the second set of electrodes of the first filter is connected to the fifth set of electrodes of the second filter, the first set of electrodes and the fourth set of electrodes configured to receive the same input signal and the second and fourth interdigital transducers configured to jointly output a filtered signal, the first and second Lamb wave filters having same relative band-gaps.

2. The circuit of claim 1 wherein the first and second sets of electrodes contain 20 or fewer electrodes.

3. The circuit of claim 2 wherein the first and second sets of electrodes contain 16 or fewer electrodes.

4. The circuit of claim 1 wherein a pitch of the third set of electrodes is greater than a pitch of either of the first or second sets of electrodes.

5. The circuit of claim 4 wherein the pitch of the third set of electrodes is between 1.3 μm and 1.4 μm and the pitch of the first and second sets of electrodes is between 1.1 μm and 1.3 μm.

6. The circuit of claim 1 wherein a pitch of the third set of electrodes is less than a pitch of either of the first or second sets of electrodes.

7. The circuit of claim 6 wherein the pitch of the third set of electrodes is between 1 μm and 1.1 μm and the pitch of the first and second sets of electrodes is between 1.1 μm and 1.3 μm.

8. The circuit of claim 1 wherein a pitch of the third set of electrodes is equal to a pitch of either of the first or second sets of electrodes.

9. The circuit of claim 8 wherein the pitch of all sets of electrodes of the first Lamb wave filter is between 1.1 μm and 1.3 μm.

10. The circuit of claim 1 wherein the first and second sets of electrodes contain a same number of electrodes.

11. The circuit of claim 1 wherein the third set of electrodes contains a greater number of electrodes than either of the first or second sets of electrodes.

12. The circuit of claim 1 wherein the third set of electrodes contains a smaller number of electrodes than either of the first or second sets of electrodes.

13. The circuit of claim 1 wherein the third set of electrodes contains a same number of electrodes as either of the first or second sets of electrodes.

14. The circuit of claim 1 wherein a pitch of each of the first, second, and third sets of electrodes is between 0.5 μm and 100 μm.

15. The circuit of claim 1 wherein a pitch of the first and second sets of electrodes is the same.

16. The circuit of claim 1 wherein the substrate has a thickness equal to 0.1 to 1 times a wavelength of the first Lamb wave.

17. The circuit of claim 1 wherein each electrode of the first Lamb wave filter has a thickness is equal to 0.01 to 0.5 times a wavelength of the first Lamb wave.

18. The circuit of claim 1 wherein the first and second Lamb wave filters have different passbands.

19. A circuit comprising:
a first filter including a substrate having a center region and two edge regions and configured to propagate a first Lamb wave within, a first set of electrodes arranged as a first interdigital transducer disposed on one of the two edge regions and configured to receive an input signal, a second set of electrodes arranged as a second interdigital transducer disposed on the other of the two edge regions and configured to provide a filtered output signal, an entirety of the center region of the substrate extending between the first interdigital transducer and the second interdigital transducer being free of electrodes; and
a second filter including a second substrate having a second center region and two second edge regions and configured to propagate a second Lamb wave within, a third set of electrodes arranged as a third interdigital transducer disposed on one of the two second edge regions, a fourth set of electrodes arranged as a fourth interdigital transducer disposed on the other of the two second edge regions, and a fifth set of electrodes disposed parallel to the third and fourth sets of electrodes on the second center region of the second substrate, the first filter and the second filter connected in a series parallel configuration such that the second set of electrodes of the first filter is connected to the third set of electrodes of the second filter, the fourth set of electrodes of the second filter is connected to ground, the first set of electrodes of the first filter is configured to receive an input signal and the second set of electrodes of the first filter and the third set of electrodes of the second filter are configured to jointly output a filtered signal.

20. The circuit of claim 19 wherein the first and second filters have same passbands.

21. A circuit comprising:
a first filter including a substrate having a center region and two edge regions and configured to propagate a first Lamb wave within, a first set of electrodes arranged as a first interdigital transducer disposed on one of the two edge regions and configured to receive an input signal, a second set of electrodes arranged as a second interdigital transducer disposed on the other of the two edge regions and configured to provide a filtered output signal, and a third set of electrodes disposed parallel to the first and second sets of electrodes on the center region of the substrate; and
a second filter including a second substrate having a second center region and two second edge regions and configured to propagate a second Lamb wave within, a fourth set of electrodes arranged as a third interdigital transducer disposed on one of the two second edge regions and configured to receive an input signal, a fifth set of electrodes arranged as a fourth interdigital transducer disposed on the other of the two second edge regions and configured to provide a filtered output signal, and a sixth set of electrodes disposed parallel to the fourth and fifth sets of electrodes on the second center region of the second substrate, the first filter and the second filter connected in series such that the second set of electrodes of the first filter is connected to the fourth set of electrodes of the second filter, the first set of electrodes of the first filter configured to receive an input signal and the fifth set of electrodes of the second filter is configured to output a filtered signal, the first filter and the second filter having different band-gaps and same passbands.

* * * * *